US011698295B2

United States Patent
Watanabe et al.

(10) Patent No.: US 11,698,295 B2
(45) Date of Patent: Jul. 11, 2023

(54) OPTICAL SENSOR INCLUDING A HARD RESIN AND A SOFT RESIN AND PROXIMITY SENSOR INCLUDING THE SAME

(71) Applicant: Murata Manufacturing Co., Ltd., Nagaokakyo (JP)

(72) Inventors: Hiroshi Watanabe, Nagaokakyo (JP); Kohei Sugahara, Nagaokakyo (JP); Takatoshi Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 8 days.

(21) Appl. No.: 17/569,764

(22) Filed: Jan. 6, 2022

(65) Prior Publication Data
US 2022/0128397 A1 Apr. 28, 2022

Related U.S. Application Data

(63) Continuation of application No. PCT/JP2020/023043, filed on Jun. 11, 2020.

(30) Foreign Application Priority Data

Jul. 10, 2019 (JP) .................... 2019-128197

(51) Int. Cl.
*G01J 1/02* (2006.01)
*G01V 8/20* (2006.01)
(Continued)

(52) U.S. Cl.
CPC ............. *G01J 1/0271* (2013.01); *G01V 8/20* (2013.01); *H01L 31/12* (2013.01); *B25J 19/021* (2013.01); *G01J 2001/446* (2013.01)

(58) Field of Classification Search
CPC .... G01J 1/0271; G01J 2001/446; G01V 8/20; B25J 19/021; B25J 19/02; H01L 31/12; H01L 31/0203; G01S 17/02
See application file for complete search history.

(56) References Cited

U.S. PATENT DOCUMENTS

2004/0245528 A1* 12/2004 Hiramoto ............... H01L 33/58
257/E33.059
2006/0237540 A1* 10/2006 Saxena ............. G06K 7/10732
235/454
(Continued)

FOREIGN PATENT DOCUMENTS

JP 60-62496 U 5/1985
JP 2001291893 A 10/2001
(Continued)

OTHER PUBLICATIONS

Office Action in JP2021-530542, dated Nov. 8, 2022, 3 pages.
Official Communication issued in International Patent Application No. PCT/JP2020/023043, dated Sep. 15, 2020.

*Primary Examiner* — Jennifer D Bennett
(74) *Attorney, Agent, or Firm* — Keating & Bennett, LLP

(57) ABSTRACT

An optical sensor includes a light emitter to emit light, a light receiver to receive the light emitted from the light emitter, a first resin body that covers the light emitter and the light receiver to transmit the light emitted from the light emitter to emit the light outside, and a second resin body that seals the light emitter and the light receiver, in which the second resin body is included inside the first resin body, and the second resin body is harder than the first resin body.

20 Claims, 6 Drawing Sheets

(51) Int. Cl.
    *H01L 31/12*    (2006.01)
    *B25J 19/02*    (2006.01)
    *G01J 1/44*    (2006.01)

(56) References Cited

U.S. PATENT DOCUMENTS

2012/0197093 A1    8/2012    LeBoeuf et al.
2016/0260862 A1    9/2016    Kugiyama

FOREIGN PATENT DOCUMENTS

| JP | 2008-150437 A | 7/2008 |
| JP | 2016-162895 A | 9/2016 |
| JP | 2017-216281 A | 12/2017 |

\* cited by examiner

OPTICAL SENSOR INCLUDING A HARD RESIN AND A SOFT RESIN AND PROXIMITY SENSOR INCLUDING THE SAME

CROSS REFERENCE TO RELATED APPLICATIONS

This application claims the benefit of priority to Japanese Patent Application No. 2019-128197 filed on Jul. 10, 2019 and is a Continuation Application of PCT Application No. PCT/JP2020/023043 filed on Jun. 11, 2020. The entire contents of each application are hereby incorporated herein by reference.

BACKGROUND OF THE INVENTION

1. Field of the Invention

The present invention relates to an optical sensor and a proximity sensor including the optical sensor.

2. Description of the Related Art

In recent years, various sensors have been proposed which are mounted on a robot hand or the like and enable various types of sensing including tactile sense. Such sensors include, for example, a proximity sensor having a function of a tactile sensor as described in Japanese Unexamined Patent Application Publication No. 60-62496.

Japanese Unexamined Patent Application Publication No. 60-62496 discloses a composite sensor to be attached to a fingertip surface of a robot hand that performs an operation of gripping an object or the like. The composite sensor disclosed in Japanese Unexamined Patent Application Publication No. 60-62496 includes a light-transmissive flexible plate-shaped portion, a light receiving portion arranged on the flexible plate-shaped portion, a light emitting portion that irradiates the flexible plate-shaped portion from behind the light receiving portion, and an electric circuit that controls the light receiving portion and the light emitting portion. An elastic body covers the light receiving portion, and a light-shielding layer that transmits light from the light emitting portion in a limited manner is provided on the back surface side of the flexible plate-shaped portion on which the light receiving portion is arranged.

A function as a proximity sensor and a function as a contact sensor can be obtained by detecting an amount of reflected light, which is emitted from the light emitting portion, passes through a slit and the elastic body, hits an object, and returns, with the light receiving portion arranged on the front surface of the plate-shaped portion in which the slit is formed on the back surface.

However, in the related art, since an elastic body which is easily deformed is provided on the light receiving portion, when an external force is applied to the sensor, distortion directly influenced the light receiving portion, and there is a problem in that durability is reduced.

SUMMARY OF THE INVENTION

Preferred embodiments of the present invention provide optical sensors and proximity sensors each with improved durability.

An optical sensor according to a preferred embodiment of the present invention includes a light emitter to emit light, a light receiver to receive the light emitted from the light emitter, a first resin body that covers the light emitter and the light receiver to transmit the light emitted from the light emitter and emit the light outside, and a second resin body that seals the light emitter and the light receiver, wherein the second resin body is included inside the first resin body, and the second resin body is harder than the first resin body.

A proximity sensor according to a preferred embodiment of the present invention includes an optical sensor including a light emitter to emit light, a light receiver to receive the light emitted from the light emitter, a first resin body that covers the light emitter and the light receiver to transmit the light emitted from the light emitter and emit the light outside, and a second resin body that seals the light emitter and the light receiver, wherein the second resin body is included inside the first resin body, and the second resin body is harder than the first resin body, and a controller to detect proximity and contact of an object based on a signal of the light receiver.

According to preferred embodiments of the present invention, optical sensors and proximity sensors with improved durability are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, optical sensors and proximity sensors according to preferred embodiments of the present invention will be described with reference to the accompanying drawings. Each of the preferred embodiments is an example, and partial replacement or combination of configurations illustrated in different preferred embodiments is possible. In a modification, description of matters common to Preferred Embodiment 1 will be omitted, and only different points will be described. In particular, the same operation and advantageous effects of the same or corresponding configuration will not be described in each preferred embodiment.

Preferred Embodiment 1

In Preferred Embodiment 1 of the present invention, detection of proximity of an object by a simple optical mechanism including an optical sensor will be described as an example of a proximity sensor according to a preferred embodiment of the present invention.

1. Configuration

Figure 1:
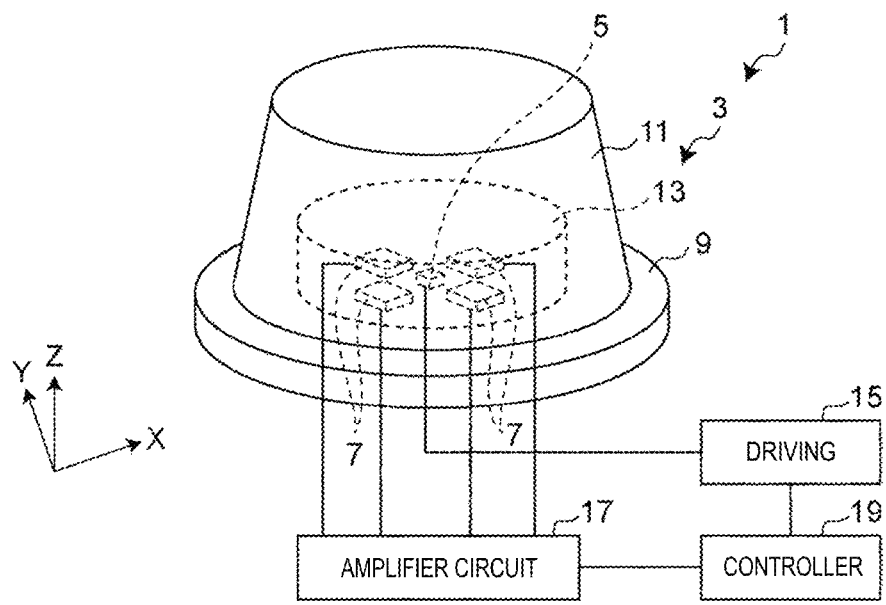
FIG. 1 is a diagram for illustrating a proximity sensor according to Preferred Embodiment 1 of the present invention.
Figure 2A:
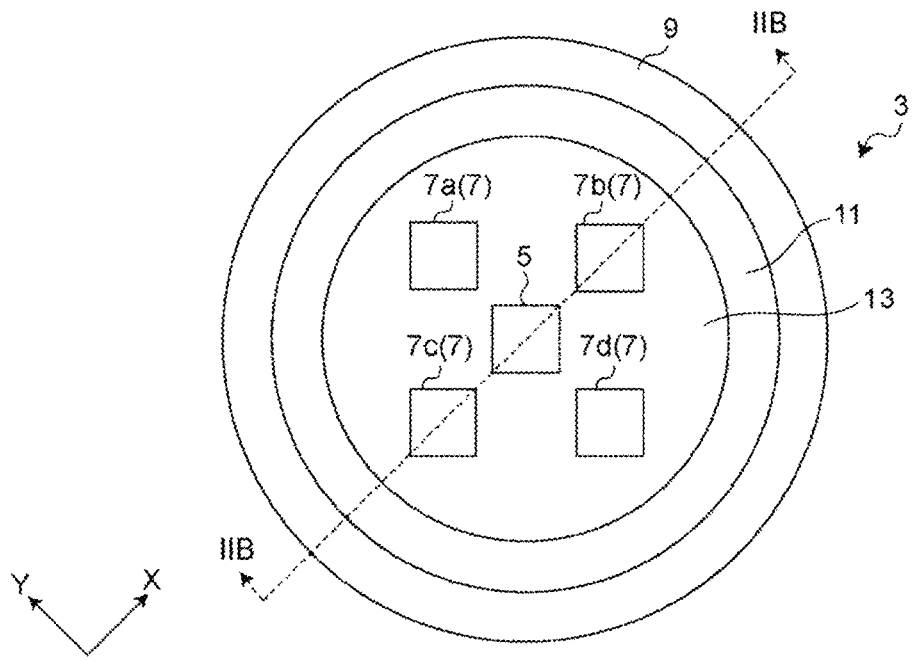
FIG. 2A is a top view of an optical sensor according to Preferred Embodiment 1 of the present invention.
Figure 2B:
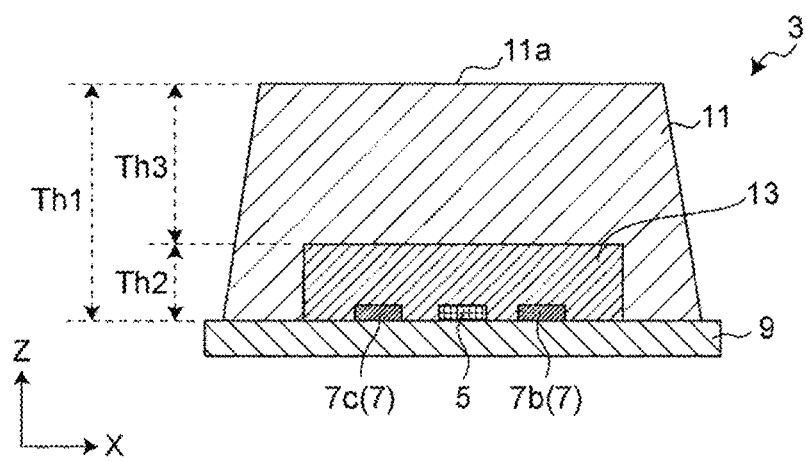
FIG. 2B is a longitudinal sectional view seen from an arrow IIB of FIG. 2A.

A configuration of the proximity sensor according to Preferred Embodiment 1 will be described with reference to FIGS. 1 to 2B. FIG. 1 is a diagram for illustrating an overview of a proximity sensor 1 according to Preferred Embodiment 1. FIG. 2A is a top view illustrating an optical sensor 3. FIG. 2B is a longitudinal sectional view of the optical sensor 3.

As illustrated in FIG. 1, the proximity sensor 1 according to Preferred Embodiment 1 includes the optical sensor 3, a driver 15, an amplifier circuit 17, and a controller 19. The proximity sensor 1 can be applied to, for example, a robot hand in which various objects to be gripped are objects to be sensed.

The optical sensor 3 includes a light emitter 5, a light receiver 7, a substrate 9, a first resin body 11, and a second resin body 13. The first resin body 11 is an example of a cover to cover the light emitter 5 and the light receiver 7. Hereinafter, in the optical sensor 3, a direction in which the first resin body 11 protrudes is referred to as a "Z direction", and two directions that are orthogonal or substantially orthogonal to the Z direction and are orthogonal or substantially orthogonal to each other are referred to as an "X direction" and a "Y direction". Note that a positive direction of Z is an upward direction, and a negative direction of Z is a downward direction.

The optical sensor 3 according to Preferred Embodiment 1 causes the light emitter 5 to emit light inside the second resin body 13, detects, by the light receiver 7, the light that passes through the second resin body 13 and the first resin body 11 and is reflected by an object, and outputs a light receiving signal P1 corresponding to an amount of the received light from the light receiver 7.

The light emitter 5 is, for example, a solid-state light emitter such as a Vertical Cavity surface emitting laser (VCSEL) or an LED. When a surface emitting laser is used as the light emitter 5, a laser with a narrow emission angle can be emitted. As a result, it is possible to reduce direct incidence of light emitted from the light emitter 5 on the light receiver 7 without being reflected by an object. As a result, the offset of the light receiver 7 can be reduced, and the S/N can be improved. Note that in a case where an LED is used as the light emitter 5, light irradiated from the LED may have directivity by providing the LED with a reflector. The light emitter 5 may be, for example, a solid-state light emitter other than a surface emitting laser and an LED. In addition, the optical sensor 3 may include a collimating lens that collimates the light from the light emitter 5.

The light emitter 5 emits, for example, light having a wavelength in a near-infrared region. In Preferred Embodiment 1, a peak wavelength of the light emitted from the light emitter 5 is in a range, for example, between about 700 nm and about 1000 nm, and is about 850 nm, for example, in Preferred Embodiment 1. Light having the peak wavelength within this range can be received by a light receiver made of, for example, an Si-based material.

Figure 4:
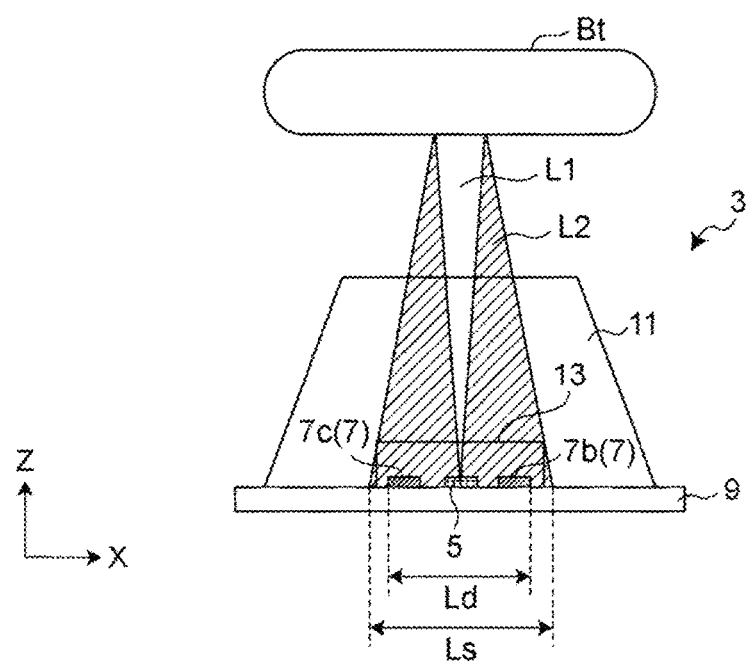
FIG. 4 is a diagram for illustrating detection of proximity of an object.

The light receiver 7 detects an amount of reflected light obtained by reflecting the light emitted from the light emitter 5 on an object Bt (see FIG. 4). The light receiver 7 that detects the reflected light includes, for example, a light receiver including a photodiode (PD). The light receiver 7 includes at least one light receiver. In FIG. 1, the light receiver 7 includes four light receivers 7a to 7d. The light receiver 7 receives light and generates the light receiving signal P1 indicating a light receiving result. The generated light receiving signal P1 is transmitted to the amplifier circuit 17. The light receiver 7 may include various light receivers, not limited to a photodiode, for example, a position detection element (PSD) or a CMOS image sensor (CIS).

The substrate 9 is, for example, a resin substrate. The substrate 9 supports the light emitter 5 and the light receivers 7a to 7d of the light receiver 7, which are disposed on the same or substantially the same plane. For example, the light emitter 5 is disposed at the center or approximate center of the disk-shaped substrate 9. The four light receivers 7a to 7d of the light receiver 7 surround the light emitter 5 with the light emitter 5 as a center, and the light receivers 7a and 7d and the light receivers 7b and 7c are arranged diagonally with two of the four light receivers as a pair. Further, the substrate 9 supports the second resin body 13 that seals the light emitter 5 and the light receiver 7, and the first resin body 11 that covers a side portion and an upper portion of the second resin body 13. Since the light emitter 5 and the light receivers 7a to 7d are located on the same or substantially the same plane, the optical sensor 3 can be reduced in size and height.

The first resin body 11 seals the second resin body 13 including the light emitter 5 and the light receiver 7. The first resin body 11 has, for example, a rotating body shape and, for example, a truncated cone shape. The first resin body 11 having the truncated cone shape is arranged such that a central axis thereof coincides with a central axis of the second resin body 13 having a cylindrical shape, and is provided on the substrate 9 while including the second resin body 13 inside the first resin body 11. The first resin body 11 is an elastic body that deforms in response to an external force, such as external stress. The first resin body 11 is made of, for example, a silicone-based or epoxy-based resin. A diameter of a lower surface of the first resin body 11 is, for example, about 0.5 mm to about 50 mm. A diameter of an upper surface of the first resin body 11 is equal to or smaller than the diameter of the lower surface. A thickness Th1 of the first resin body 11 is a thickness from an upper surface of the substrate 9 to an outer surface of the first resin body 11 in a central axis direction of the light emitted from the light emitter 5. The thickness Th1 of the first resin body 11 is, for example, about 5 mm.

The second resin body 13 seals the light emitter 5 and the light receiver 7 on the substrate 9. A side surface and an upper surface of the second resin body 13 are covered with the first resin body 11. The second resin body 13 has, for example, a rotating body shape and, for example, a cylindrical shape. The light emitter 5 is positioned at the center or approximate center of the second resin body 13 having a cylindrical shape. The second resin body 13 includes the light receivers 7a to 7d surrounding the light emitter 5 and is provided on the substrate 9. The second resin body 13 is made of, for example, a silicone-based resin including a wavelength filter that cuts light emitted from the light emitter 5 in a wavelength region on a lower wavelength side than the peak wavelength. Examples of such silicone-based resins include, for example, modified silicones having organic substituents other than methyl groups and phenyl groups as a substituent, and more specifically, include AIR-7051A/B manufactured by Shin-Etsu Silicone Co., Ltd. A diameter of the second resin body 13 is smaller than the diameter of the lower surface of the first resin body 11. A thickness Th2 of the second resin body 13 is thicker than thicknesses of the light emitter 5 and the light receivers 7a to 7d. In addition to the shape described above, the shape of the second resin body 13 may be a rectangular or substantially rectangular parallelepiped, a truncated cone, or a hemispherical shape, for example.

Figure 3:
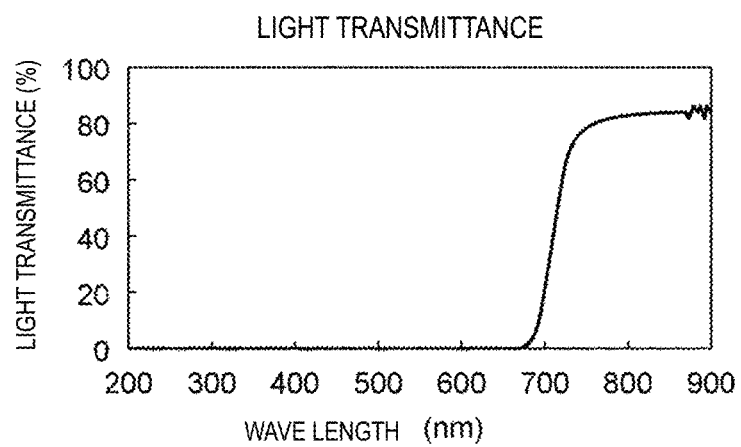
FIG. 3 is a graph showing light transmittance of a second resin body according to Preferred Embodiment 1 of the present invention

FIG. 3 is a graph showing an example of the light transmittance of the second resin body 13. With the second resin body 13, the transmittance of light in the wavelength region of, for example, about 680 nm from the near ultraviolet region is substantially 0, and it is possible to significantly reduce incidence of ambient light mainly in the visible wavelength region from about 380 nm to about 780 nm on the light receiver 7. In such a wavelength filter, for example, the transmittance of light on the short wavelength side from the peak wavelength is equal to or less than about 10% with respect to the transmittance in the peak wavelength of light emitted from the light emitter 5.

As shown in FIG. 3, the second resin body 13 also attenuates the transmittance in the peak wavelength of the light emitted from the light emitter 5 by about ten and several percent. When the thickness Th2 of the second resin body 13 is small, in an optical path in which light emitted from the light emitter 5 is reflected by the object Bt and enters the light receiver 7, it is possible to reduce or prevent attenuation of light in the second resin body 13 and to increase light receiving sensitivity. For example, the thickness Th2 of the second resin body 13 is smaller than a thickness Th3 that is the difference between the thickness Th1 of the first resin body 11 and the thickness Th2 of the second resin body 13. Note that in a case where the thickness Th3 is small, since absorption of light emitted from the light emitter 5 and reflected by the object Bt is reduced, it is useful for improving accuracy of the proximity sensor. In addition, in a case where the thickness Th3 is large, since the range in which the first resin body 11 can be deformed due to pushing after the object Bt comes into contact with the first resin body 11 is large, the detection range of an amount of pushing of the object Bt can be widened. Therefore, it is useful for improving the function as a contact sensor. Here, the thickness Th2 is a thickness from the upper surface of the substrate 9 to an outer surface of the second resin body 13 in the central axis direction of the light emitted from the light emitter 5. In other words, the thickness Th2 can be regarded as the shortest distance of light emitted by the light emitter 5 from the upper surface of the substrate 9 to an interface between the first resin body 11 and the second resin body 13. In a case where the second resin body 13 has, for example, a cylindrical shape or a truncated cone shape, the thickness TH2 is a length of a rotation center axis of the second resin body 13. In a case where the second resin body 13 has a hemispherical shape, for example, the thickness Th2 is a length of radius.

The second resin body 13 is harder than the first resin body 11. A hardness of the first resin body 11 is, for example, from about Shore A20 to about Shore A80, and for example, from about Shore A30 to about Shore A50. A hardness of the second resin body 13 is, for example, from about Shore D40 to about Shore D90, and for example, from about Shore D60 to about Shore D80. As described above, the light emitter 5 and the light receiver 7 are sealed with the second resin body 13 having a high hardness, and the periphery thereof is sealed with the first resin body 11 that is softer than the second resin body 13. Accordingly, even when external forces are applied to the optical sensor 3 and the first resin body 11 is deformed, the second resin body 13 is not easily deformed, therefore, it is possible to reduce direct strain applied to the light emitter 5 and the light receivers 7a to 7d, and to improve durability and reliability.

A glass-transition temperature Tg2 of the second resin body 13 may be higher than a glass-transition temperature Tg1 of the first resin body 11. For example, the glass-transition temperature Tg2 of the second resin body 13 is equal to or higher than about 50° C. In this case, even when the optical sensor 3 is used in a high-temperature environment, deformation of the second resin body 13 can be prevented and the load of the object Bt can be detected.

When the first resin body 11 and the second resin body 13 are made of the same base material, the close contact property between the first resin body 11 and the second resin body can be improved. Accordingly, even when an environmental load, a repeated load from the object Bt over a long period of time, or an excessive load is applied, it is possible to reduce or prevent the occurrence of peeling at the resin interface between the first resin body 11 and the second resin body 13 and to provide a sensor having excellent durability and reliability.

Both the first resin body 11 and the second resin body can be made of, for example, a silicone-based material. Furthermore, the first resin body 11 is made of, for example, methylsilicone in which all substituents are made of methyl groups, or phenylsilicone in which substituents are made of methyl groups and phenyl groups. The second resin body 13 is made of, for example, modified silicone including an organic substituent other than a methyl group or a phenyl group as a substituent. As such, with the first resin body 11 and the second resin body 13, it is possible to provide the second resin body 13 that is harder than the first resin body 11 using the same base material. Note that, for example, an epoxy resin having a different hardness may be used in addition to the silicone resin.

The driver 15 drives the light emitter 5 by supplying power to the light emitter 5 in accordance with a timing signal from the controller 19. Thus, the light emitter 5 can emit light at a predetermined cycle.

The amplifier circuit 17 amplifies the light receiving signal P1 detected by the light receivers 7a to 7d of the light receiver 7 and transmits the amplified signals to the controller 19.

The controller 19 analyzes the light receiving signal P1 from the light receiver 7 and detects the proximity and load of the object Bt. Further, the controller 19 controls a light emission cycle of the light emitter 5 and a light detection cycle of the light receiver 7. The controller 19 includes, for example, a CPU, a microprocessor, or an FPGA. Note that the optical sensor 3 may be provided as a module separate from the driver 15, the amplifier circuit 17, and the controller 19.

2. Operation

Next, the operation of the proximity sensor 1 will be described below. FIG. 4 illustrates a state in which the object Bt is close to the optical sensor 3. The optical sensor 3 according to Preferred Embodiment 1 performs proximity sensing in which a state of the object Bt spaced apart in the vicinity of the first resin body 11 is sensed from the light receiving signal P1.

In the optical sensor 3, as illustrated in FIG. 4, the light emitter 5 emits light L1 inside the second resin body 13. The light L1 emitted from the light emitter 5 passes through the second resin body 13 and the first resin body 11 and is reflected by the object Bt, so that reflected light L2 is generated. The reflected light L2 passes again through the first resin body 11 and the second resin body 13 and enters the light receiver 7.

In a case where the object Bt and the optical sensor 3 are not yet in contact with each other and there is a distance between the object Bt and the optical sensor 3, the reflected light L2 is diffused toward the light receiver 7. The light receivers 7a to 7d are designed so that a diameter Ls of a spot size of the reflected light L2 is larger than an arrangement diameter Ld between the light receivers 7b and 7c or between the light receivers 7a and 7d facing each other of the light receiver 7. Accordingly, in a case where the object Bt is not in contact with the first resin body 11 of the optical sensor 3, the light receiving signal P1 indicating the light receiving result corresponding to the state in which the first resin body 11 is not deformed is generated.

Figure 5:
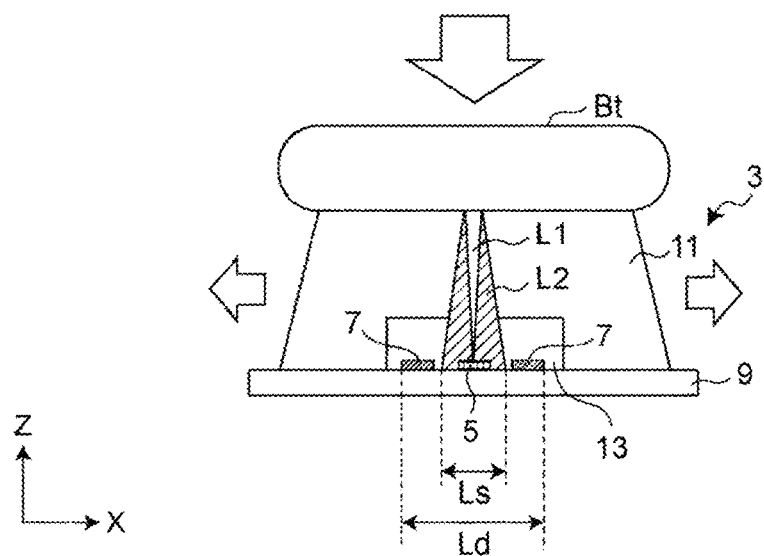
FIG. 5 is a diagram for illustrating detection of a load of an object.

FIG. 5 illustrates a state in which the object Bt comes into contact with the optical sensor 3 and further presses the optical sensor 3 downward. In the example of FIG. 5, the first resin body 11 of the optical sensor 3 is deformed so as to expand laterally (in an XY plane direction) in accordance with the contact force applied by contact with the object Bt. The optical sensor 3 performs tactile sensing for sensing various contact forces in addition to the above-described proximity sensing by outputting, as the light receiving signal P1, light receiving results that change in accordance with such deformation.

Figure 6:
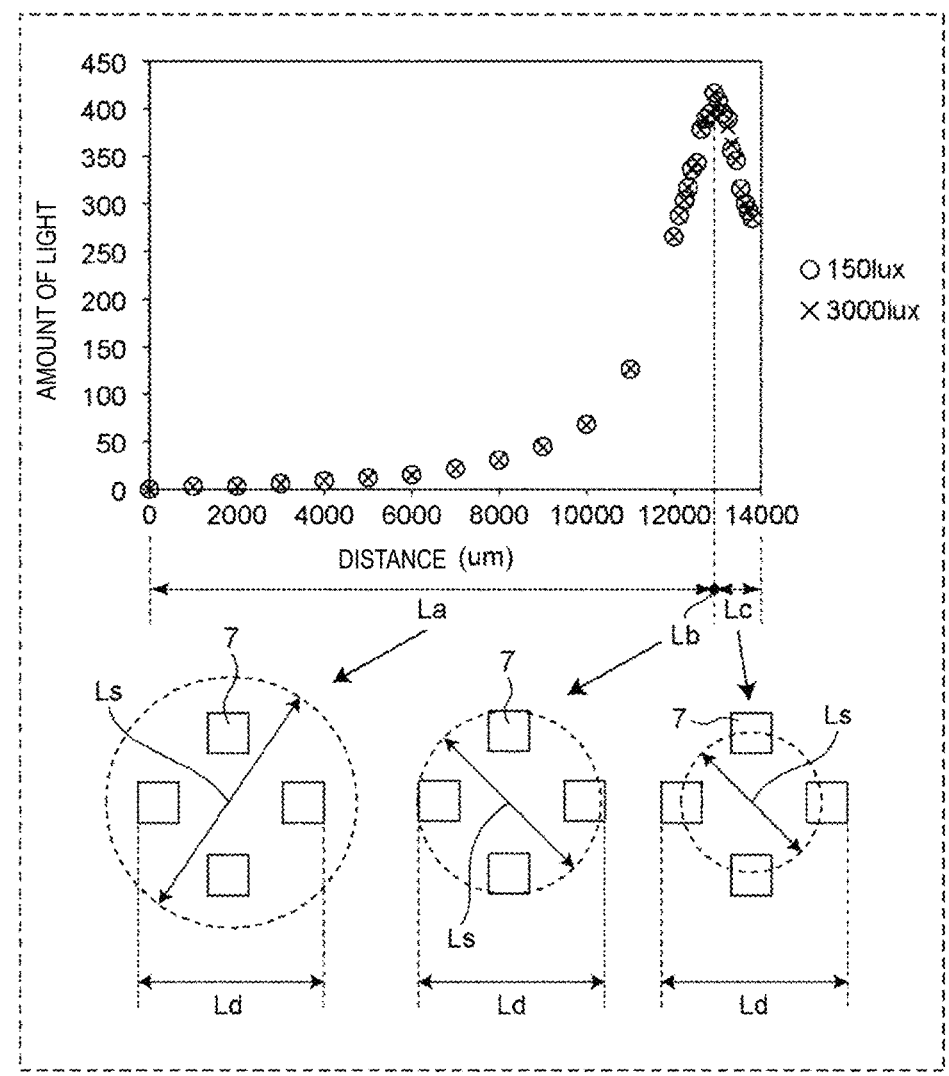
FIG. 6 is a graph showing an amount of light received by a light receiver in a process of proximity and contact of an object.

FIG. 6 is a graph showing the amount of light received by the light receiver 7 in the process of proximity and contact of the object Bt. The graph shows a change in the output value of the optical sensor 3 in a case where the object Bt is brought close to the optical sensor 3 from a position spaced apart from the upper surface of the optical sensor 3 by about 13 mm and is further pushed in even after coming into contact with the upper surface of the first resin body 11 of the optical sensor 3. In FIG. 6, a circle indicates a change in the amount of light received by the light receiver 7 under a condition in which illuminance of disturbance light applied to the optical sensor 3 is about 150 lux. In addition, a cross mark indicates a change in the amount of light received by the light receiver 7 under a condition in which the illuminance of the disturbance light is about 3000 lux. As an example of increasing the influence of disturbance light, about 3000 lux is obtained as a result of actively irradiating the optical sensor 3 with indoor illumination, such as fluorescent light, for example.

In FIG. 6, a section La indicates a section until the object Bt comes into contact with the upper surface of the first resin body 11 of the optical sensor 3 from above the optical sensor 3 in the process of approaching the optical sensor 3. The diameter Ls of the spot size of the reflected light L2 in the section La is larger than the arrangement diameter Ld of the light receivers 7a to 7d. In the section La, the closer the object Bt is to the optical sensor 3, the smaller the diameter Ls is, so that the amount of light received by the light receivers 7a to 7d increases. The controller 19 can estimate a distance from the optical sensor 3 to the object Bt from such a change in the amount of light.

In Preferred Embodiment 1, as indicated by a position Lb, the light receivers 7a to 7d are designed such that the arrangement diameter Ld of the light receivers 7a to 7d is equal or substantially equal to the diameter Ls of the spot size of the reflected light L2 when the object Bt just contacts the upper surface of the first resin body 11. Thus, when the object Bt just contacts the optical sensor 3, the amount of received light detected by the light receiver 7 is maximized. Therefore, contact between the object Bt and the optical sensor 3 can be detected by detecting an inflection point of the change in the amount of light.

Section Lc indicates a section from when the object Bt comes into contact with the upper surface of the first resin body 11 to when the object Bt further presses the first resin body 11 downward. After the object Bt comes into contact with the upper surface of the first resin body 11, as the object Bt presses down the first resin body 11, the diameter Ls of the spot size of the reflected light L2 becomes smaller than the arrangement diameter Ld of the light receivers 7a to 7d, so that the amount of light to be detected decreases.

As described above, the light receiving result of the reflected light L2 changes according to the state in which the first resin body 11 is deformed by the contact force of the object Bt. Therefore, it is possible to perform tactile sensing by the light receiving signal P1 from the light receiver 7. For example, various contact forces can be detected by analyzing the light receiving signal P1. A known technique can be appropriately applied as an analysis method, for example. In addition, since the results of the case where the illuminance of the disturbance light is about 150 lux and the case where the illuminance of the disturbance light is about 3000 lux are the same or substantially the same, it is indicated that the optical sensor 3 according to Preferred Embodiment 1 is a sensor that is hardly affected by the disturbance light.

Figure 7:
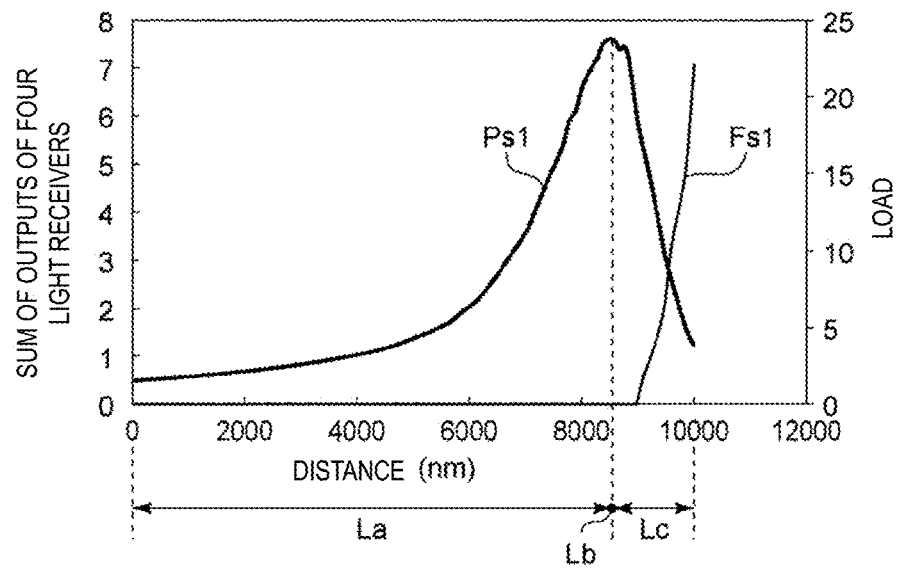
FIG. 7 is a graph showing a sum of outputs of the light receiver in the process of proximity and contact of an object.

FIG. 7 is a graph showing the sum of outputs of the light receiver 7 in the process of proximity and contact of the object Bt in a case where the reflecting surface of the object Bt is a mirror surface. The absolute value of the amount of reflected light can be increased by providing, for example, a mirror surface portion on the reflecting surface of the object Bt. A graph Ps1 indicating the sum of outputs of the four light receivers 7a to 7d gradually increases in the section La in which the object Bt approaches the upper surface of the first resin body 11, has an inflection point at the position Lb at which the object Bt just contacts the upper surface of the first resin body 11, and gradually decreases in the section Lc in which the object Bt presses down the upper surface of the first resin body 11.

In addition, a graph Fs1 indicating the load applied to the first resin body 11 is calculated by the controller 19 by analyzing the decrease in the amount of light in the section Lc. The graph Fs1 indicating the load increases in the section Lc.

Figure 8:
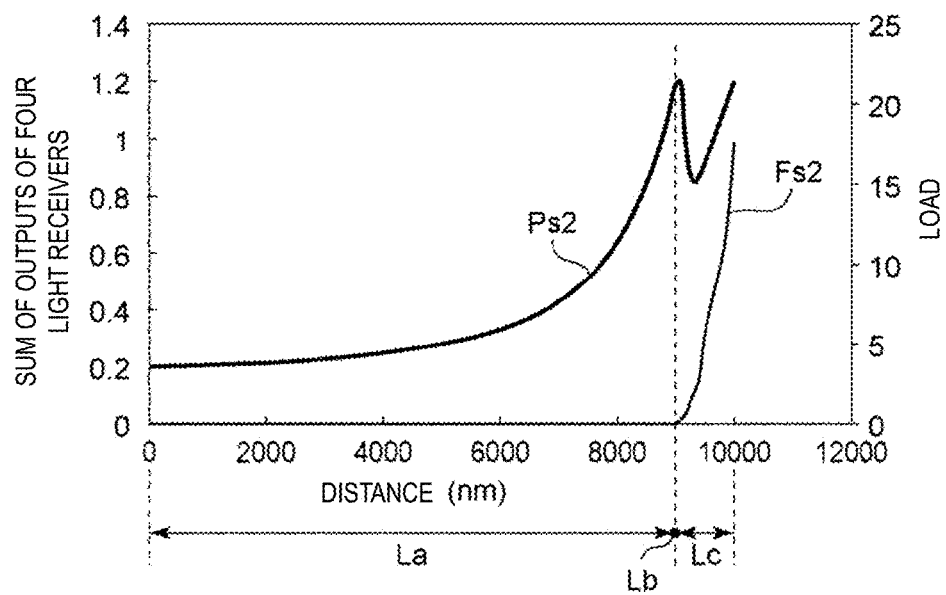
FIG. 8 is a graph showing a sum of outputs of the light receiver in the process of proximity and contact of an object.

FIG. 8 is a graph showing the sum of outputs of the light receiver 7 in the process of proximity and contact of the object Bt in a case where the reflecting surface of the object Bt is a scattering body. In the case where the reflecting surface of the object Bt is a scattering body, the absolute value of the amount of reflected light is small as compared with the case where the reflecting surface is a mirror surface.

In the section La in which the object Bt approaches the optical sensor 3, the reflected light L2 passes through respective media of the object Bt→the air→the first resin body 11. As at the position Lb and in the section Lc, when the object Bt comes into contact with the optical sensor 3, the reflection light L2 passes through the object Bt→the first resin body 11. In this way, since there is no air layer in the optical path at the position Lb and in the section Lc, the reflection condition changes greatly, and in the case where the reflecting surface of the object Bt is a scattering body, the influence is particularly large.

In addition, in the section Lc in which the object Bt pushes the first resin body 11, in the case where the reflecting surface of the object Bt is a scattering body, the spot size of the reflected light is less likely to decrease even when the object Bt approaches the light receiver 7, and thus the amount of reflected light increases as the object Bt approaches the light receiver 7.

As described above, the optical sensor 3 according to Preferred Embodiment 1 includes the light emitter 5 that emits light, the light receivers 7a to 7d that receive the light emitted from the light emitter 5, the first resin body 11 that covers the light emitter 5 and the light receivers 7a to 7d and transmits the light emitted from the light emitter 5 to emit the light outside, and the second resin body 13 that seals the light emitter 5 and the light receivers 7a to 7d. The second resin body 13 is included inside the first resin body 11, and the second resin body 13 is harder than the first resin body 11. According to this configuration, the second resin body 13 that directly seals the light emitter 5 and the light receivers 7a to 7d has a high hardness, and the first resin body 11 that is flexible covers the periphery of the second resin body 13. As a result, it is possible to reduce the direct influence of distortion caused by external forces on the light emitter 5 and the light receivers 7a to 7d, to improve the overload resistance, and to improve the durability.

In addition, the main materials of first resin body 11 and the second resin body 13 are the same-based resin. Since the first resin body 11 and the second resin body 13 are made of the same-based resin, the close contact property between the resins is strong, and the resins are hardly peeled off by, for example, strong external force, repeated external force, and environmental load, so that reliability during long-term operation can be improved.

Further, the glass-transition temperature Tg2 of the second resin body 13 is higher than the glass-transition temperature Tg1 of the first resin body 11. Thus, since the glass-transition temperature Tg2 of the second resin body 13 that directly seals the light emitter 5 and the light receivers 7a to 7d is high and the periphery thereof is covered with the flexible first resin body 11, the load can be detected in a wide temperature range.

Other Preferred Embodiments

The present invention is not limited to the above-described preferred embodiments and can be modified as follows.

Figure 9:
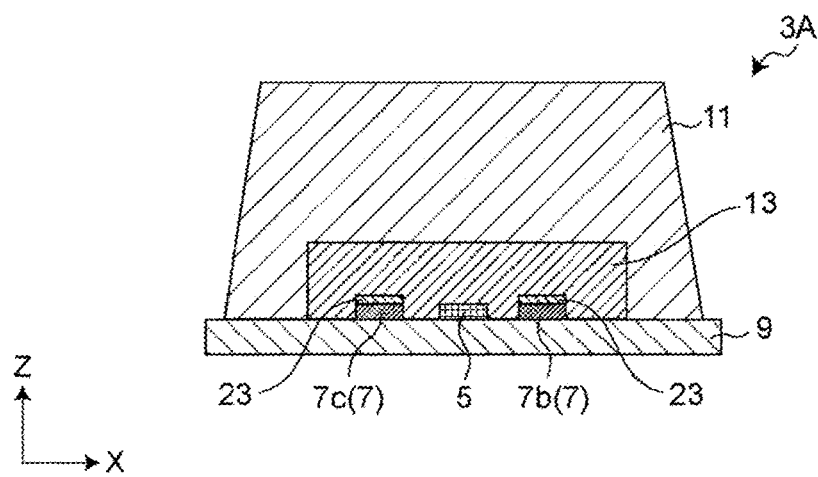
FIG. 9 is a diagram for illustrating a modification of an internal structure of the optical sensor according to Preferred Embodiment 1 of the present invention.

(1) In the above-described preferred embodiments, the optical sensor 3 includes the second resin body 13 having a wavelength filtering function, but is not limited thereto. As illustrated in FIG. 9, for example, an optical sensor 3A may be provided with a band pass filter 23 having a wavelength filtering function on the light receiving surfaces of the light receivers 7a to 7d of the light receiver 7. The band pass filter 23 is, for example, a thin film formed by vapor deposition. The thin film is, for example, $SiO_2$ or SiN. In the case where the band pass filter 23 is a thin film, since the band pass filter 23 can be formed with an accuracy of about ±60 nm with respect to the peak wavelength of the light emitters 5, noise resistance to ambient light can be further improved.

(2) In the above-described preferred embodiments, the second resin body 13 has the wavelength filter performance, but is not limited thereto. Instead of the second resin body 13, the first resin body 11 may have wavelength filter performance.

(3) Although an example in which one light emitter 5 is used as a light emitter has been described in the above-described preferred embodiments, the number of light emitters is not particularly limited to one, and a plurality of light emitters may be provided. Further, the position of the light emitter 5 is not limited to the center or approximate center, and can be appropriately set to various positions.

(4) In the example of FIG. 1, the light receivers 7b and 7c are positioned on both sides of the light emitter 5 in the X direction. In this manner, the position of the light receiver 7 is not limited to a position on a straight line on which the light emitter 5 is centered, and can be appropriately set to various positions. The light receiver 7 may be configured by arranging a plurality of light receivers around the light emitter 5. In addition, instead of the plurality of light receivers, a plurality of the light emitters 5 defining and functioning as a light emitter may be caused to emit light from a plurality of positions in a time division manner, and sensing by the optical sensor 3 may be performed.

(5) In the above-described preferred embodiments, the shape of the first resin body 11 of the optical sensor 3 is not limited to a rotating body, and may be configured using various curved surfaces, such as a spherical surface, for example.

(6) In the above-described preferred embodiments, the side portion of the second resin body 13 is also covered with the first resin body 11, but is not limited thereto. The side portion of the second resin body 13 may be exposed to the outside.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical sensor comprising:
a light emitter to emit light;
a light receiver to receive the light emitted from the light emitter;
a first resin body that covers the light emitter and the light receiver to transmit the light emitted from the light emitter and to emit the light outside; and
a second resin body that seals the light emitter and the light receiver; wherein
the second resin body is included inside the first resin body; and
the second resin body is harder than the first resin body.

2. The optical sensor according to claim 1, wherein main materials of the first resin body and the second resin body are the same-based resin.

3. The optical sensor according to claim 2, wherein the same-based resin is a silicone-based resin.

4. The optical sensor according to claim 1, wherein the second resin body has a hardness of equal to or more than about Shore D20 and equal to or less than about Shore D80.

5. The optical sensor according to claim 1, wherein a glass-transition temperature of the second resin body is higher than a glass-transition temperature of the first resin body.

6. The optical sensor according to claim 5, wherein the second resin body has a glass-transition temperature of equal to or more than about 50° C.

7. The optical sensor according to claim 1, wherein the receiver includes a plurality of receivers to receive the light emitted from the light emitter.

8. The optical sensor according to claim 1, wherein the light emitter is a Vertical Cavity surface emitting laser (VCSEL) or an LED.

9. The optical sensor according to claim 1, wherein the light receiver includes a photodiode.

10. The optical sensor according to claim 1, further comprising a resin substrate on which the light emitter and the light receiver are supported.

11. A proximity sensor comprising:
the optical sensor according to claim 1; and
a controller to detect a proximity and a contact of an object based on a signal of the light receiver.

12. The proximity sensor according to claim 11, wherein main materials of the first resin body and the second resin body are the same-based resin.

13. The proximity sensor according to claim 12, wherein the same-based resin is a silicone-based resin.

14. The proximity sensor according to claim 11, wherein the second resin body has a hardness of equal to or more than about Shore D20 and equal to or less than about Shore D80.

15. The proximity sensor according to claim 11, wherein a glass-transition temperature of the second resin body is higher than a glass-transition temperature of the first resin body.

16. The proximity sensor according to claim 15, wherein the second resin body has a glass-transition temperature of equal to or more than about 50° C.

17. The proximity sensor according to claim 11, wherein the receiver includes a plurality of receivers to receive the light emitted from the light emitter.

18. The proximity sensor according to claim 11, wherein the light emitter is a Vertical Cavity surface emitting laser (VCSEL) or an LED.

19. The proximity sensor according to claim 11, wherein the light receiver includes a photodiode.

20. The proximity sensor according to claim 11, further comprising a resin substrate on which the light emitter and the light receiver are supported.

* * * * *